US009114979B2

(12) United States Patent
Gerner et al.

(10) Patent No.: US 9,114,979 B2
(45) Date of Patent: Aug. 25, 2015

(54) METHOD AND APPARATUS FOR PRODUCING CHIP DEVICES, AND CHIP DEVICE PRODUCED BY MEANS OF THE METHOD

(75) Inventors: Michael Gerner, Bad Toelz (DE); Hans Krueger, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 964 days.

(21) Appl. No.: 13/228,971

(22) Filed: Sep. 9, 2011

(65) Prior Publication Data

US 2012/0061778 A1  Mar. 15, 2012

(30) Foreign Application Priority Data

Sep. 10, 2010  (DE) .......................... 10 2010 045 056

(51) Int. Cl.
*H01L 21/00* (2006.01)
*B81C 1/00* (2006.01)
(52) U.S. Cl.
CPC .................................. *B81C 1/00333* (2013.01)
(58) Field of Classification Search
CPC .. H01L 21/561; H01L 21/568; H01L 23/3114
USPC .................. 438/51, 464, 460; 264/272.14
See application file for complete search history.

(56) References Cited

U.S. PATENT DOCUMENTS

| 5,480,839 | A | * | 1/1996 | Ezawa et al. ................... 438/107 |
| 5,959,462 | A | * | 9/1999 | Lum ............................ 324/750.05 |
| 6,425,971 | B1 | * | 7/2002 | Silverbrook ................... 156/230 |
| 6,506,681 | B2 | * | 1/2003 | Grigg et al. ..................... 438/692 |
| 6,805,541 | B1 | * | 10/2004 | Hashimoto ..................... 425/110 |
| 7,737,001 | B2 | * | 6/2010 | Abe et al. ....................... 438/462 |
| 2003/0094695 | A1 | | 5/2003 | Hedler et al. |
| 2010/0078822 | A1 | | 4/2010 | Bauer et al. |
| 2011/0104429 | A1 | * | 5/2011 | Kushino et al. ................. 428/76 |

FOREIGN PATENT DOCUMENTS

| DE | 101 45 382 A1 | 1/2003 |
| DE | 101 56 386 A1 | 6/2003 |
| DE | 10 2009 042 920 A1 | 7/2010 |

* cited by examiner

*Primary Examiner* — Laura Menz
*Assistant Examiner* — Candice Y Chan
(74) *Attorney, Agent, or Firm* — Slater & Matsil, L.L.P.

(57) ABSTRACT

A chip device is produced providing at least one wafer having a plurality of chip components. The wafer or wafers are separated into the individual chip components and/or into groups of chip components. The individual chip components and/or the groups of chip components are applied to a carrier element, in such a way that interspaces having a predetermined width are formed between the individual chip components and/or the groups of chip components. A polymer is introduced into the interspaces in order to form a composite element composed of the chip components and a polymer matrix. The composite element is separated in such a way that chip devices composed of in each case one of the chip components and at least one section of the polymer matrix are formed. The invention furthermore relates to a chip device produced by means of the method.

20 Claims, 2 Drawing Sheets

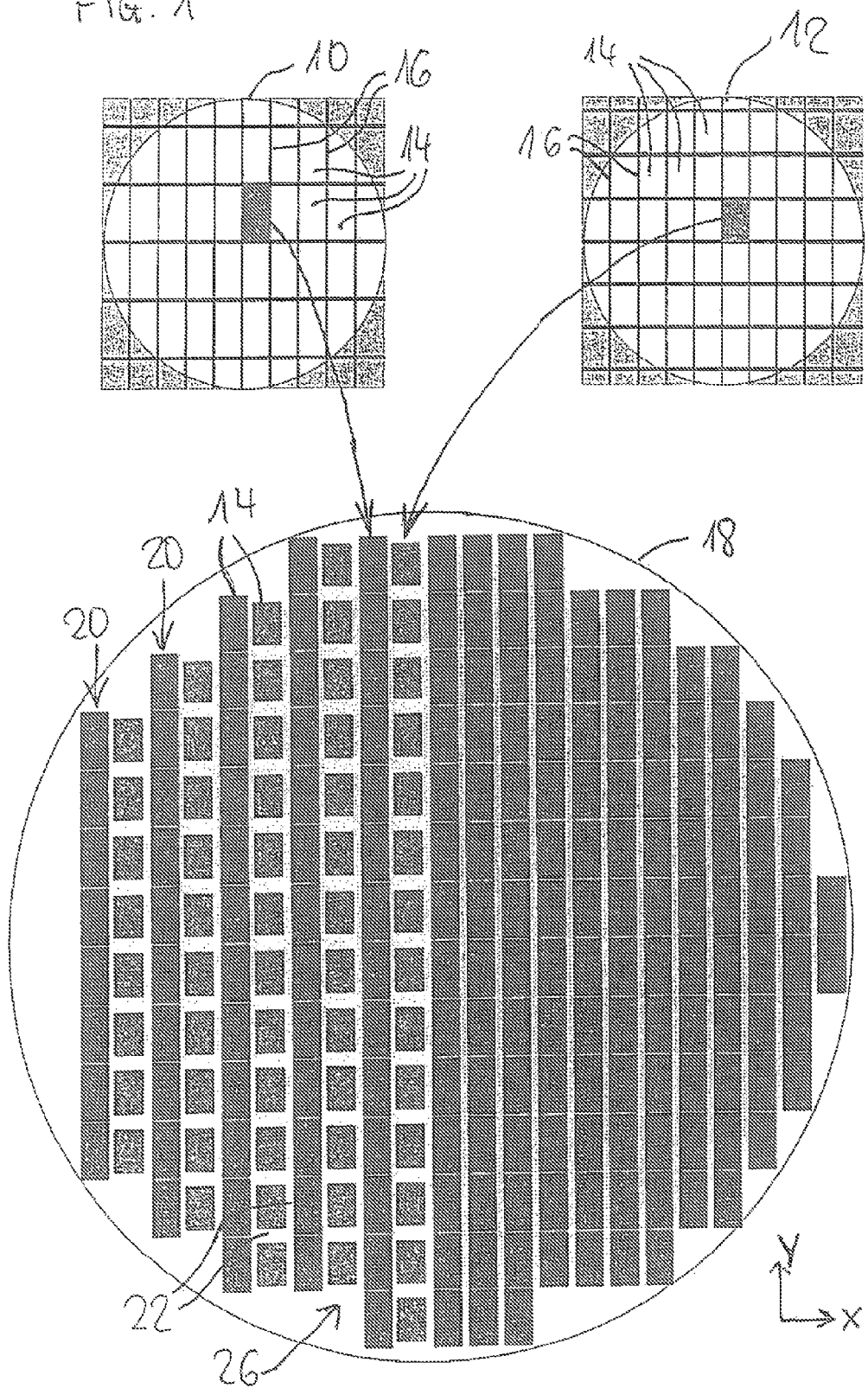

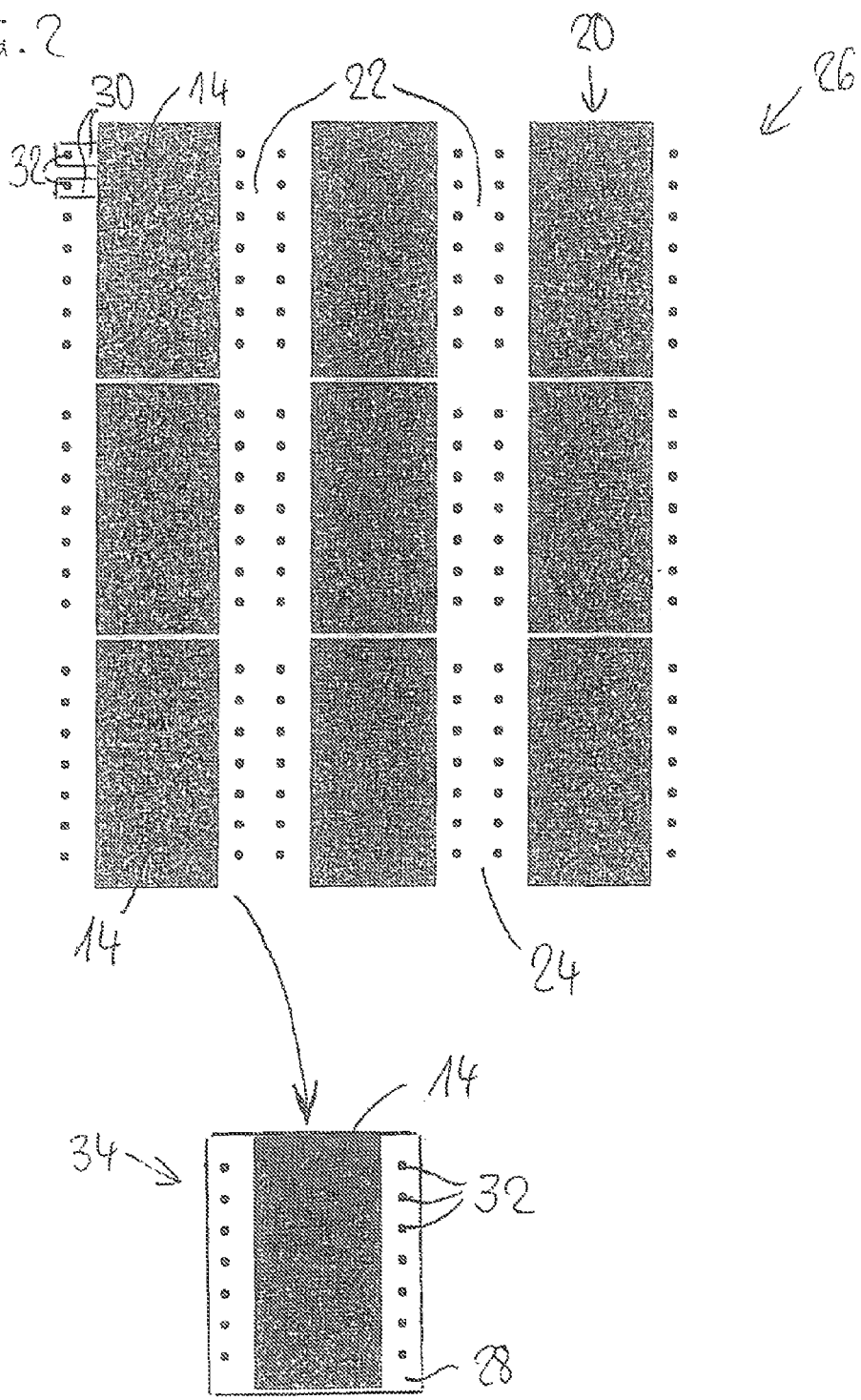

METHOD AND APPARATUS FOR PRODUCING CHIP DEVICES, AND CHIP DEVICE PRODUCED BY MEANS OF THE METHOD

This application claims priority to German Patent Application 10 2010 045 056.1, which was filed Sep. 10, 2010 and is incorporated herein by reference.

TECHNICAL FIELD

The invention relates to a method and an apparatus for producing chip devices, and to a chip device produced by means of the method.

SUMMARY OF THE INVENTION

In this case, the term "chip" stands for components composed of a crystalline material. The crystalline material can be a material for semiconductor devices. However, the crystalline material is preferably formed for MEMS devices (MEMS=microelectromechanical system) generally or as a piezoelectric material for acoustic MEMS devices. If the chip device is a MEMS device, in particular, then the latter has a mechanically movable part that is sensitive to mechanical action or mass loading. Micromechanical sensors or devices that operate with acoustic waves shall be mentioned here by way of example. In particular, a mechanical loading of the acoustically active structures is intended to be avoided since otherwise the propagation characteristic of the acoustic waves changes. Monocrystalline piezoelectric materials can be, in particular, quartz, lithium tantalate, lithium niobate or gallium orthophosphate.

In one aspect, the present invention provides a method and an apparatus for precisely producing chip devices which are embodied in a small fashion and nevertheless enable electric contact to be made with the chip device in a reliable manner. In a further aspect, the present invention provides a chip device which, after mounting onto a substrate, in particular a printed circuit board, functions reliably after a large number of cycles with changing temperatures.

In accordance with a first and second aspect, the invention is distinguished by a method and a corresponding apparatus for producing chip devices. A wafer having a plurality of chip components is provided. The wafer is separated into the individual chip components and/or into groups of chip components. The individual chip components and/or the groups of chip components are applied to a carrier element, in such a way that interspaces having a predetermined width are formed between the individual chip components and/or the groups of chip components. A polymer is introduced into the interspaces in order to form a composite element composed of the chip components and a polymer matrix. The composite element is separated, in such a way that chip devices composed of in each case one of the chip components and at least one section of the polymer matrix are formed.

This has the advantage that the polymer matrix can be used for wiring and for producing electrical connections. Accordingly, the area of the chip components can be kept small. The polymer matrix additionally makes it possible to compensate for differently isotropic or anisotropic thermal expansion of different chip components and to adapt the resulting component (chip component+polymer) to the substrate.

In one advantageous configuration, separating the wafer into the individual chip components and/or into groups of chip components is effected by means of sawing. This has the advantage that sawing can be performed in a very simple and flexible manner. Furthermore, sawing can be performed in a very cost-effective manner.

In a further advantageous configuration, separating the wafer into the individual chip components and/or into groups of chip components is effected in a first step by means of a partial incision on a first side of the wafer, and in a second step by means of areal removal of material on a second side of the wafer, the second side facing away from the first side. This has the advantage that at the same time as separating the wafer, it is also possible to realize a very small thickness of the chip components in conjunction with sufficient fracture strength. Furthermore, it is possible to prevent material from breaking out at the edges of the chip components.

In a further advantageous configuration, separating the wafer into the individual chip components and/or into groups of chip components is effected by means of laser separating. This has the advantage that the chip components can be embodied in many different forms. Furthermore, cutting waste can be avoided, and cleaning is not necessary. Moreover, laser separating enables a high separating speed. Furthermore, low costs of the process are possible.

In a further advantageous configuration, the laser separating is performed by means of a stealth laser dicing method. This has the advantage that the stealth laser method is a process without material removal, which requires no cleaning. The stealth laser dicing method can additionally be performed without cooling. Furthermore, damage to the surfaces of the wafer can be avoided.

In a further advantageous configuration, the carrier element is a tape, and the individual chip components and/or groups of chip components are applied to the tape in such a way that the chip components are arranged in one line or in a plurality of lines. This has the advantage that the chip components applied on the tape can be processed further in additional process steps in a simple manner. Furthermore, particularly when applying groups of chip components, it is possible for the number of placement operations to be kept small.

In a further advantageous configuration, the carrier element is a carrier plate. This has the advantage that the chip components applied on the carrier plate can be processed further in additional process steps in a simple manner.

In a further advantageous configuration, the individual chip components and/or groups of chip components are applied to the carrier plate in such a way that the chip components are arranged in a rectangular matrix. This has the advantage that the carrier matrix with the chip components can be processed further in a simple manner.

In a further advantageous configuration, applying the individual chip components and/or the groups of chip components to a carrier element is effected by means of die bonding or flip-chip bonding. This has the advantage that the chip components can be applied to the carrier element in a simple manner, and that the active sides of the chip components can be well protected from external influences.

In a further advantageous configuration, after the individual chip components and/or the groups of chip components have been applied to the carrier element, the positions of the chip components are determined at least in part. This enables good preparation for subsequent work steps.

In a further advantageous configuration, introducing the polymer into the interspaces is effected by means of laminating. This has the advantage that the polymer can be introduced into the interspaces simply and rapidly.

In a further advantageous configuration, introducing the polymer into the interspaces is effected by means of liquid encapsulation. This has the advantage that the polymer can be introduced into the interspaces in a simple and reliable manner. Furthermore, the surface of the composite element can be embodied in a very homogeneous fashion.

In a further advantageous configuration, introducing the polymer into the interspaces is effected by means of jet printing. This has the advantage that the polymer can be introduced into the interspaces in a simple and reliable manner. Furthermore, the surface of the composite element can be embodied very homogeneously.

In a further advantageous configuration, introducing the polymer into the interspaces is effected with a first polymer in a first direction and with a second polymer in a second direction, which is substantially perpendicular to the first direction. This has the advantage that an anisotropic thermal expansion of the chip components in different directions can be compensated for.

In a further advantageous configuration, the first polymer is introduced in the first direction by means of jet printing and the second polymer is introduced in the second direction by means of laminating or liquid encapsulation. This has the advantage that the targeted application of the first polymer in the first direction is possible by means of jet printing, and, in addition, the advantages of simple handling and a high speed of laminating or liquid encapsulation can be utilized for the second polymer.

In a further advantageous configuration, separating the composite element is effected by means of sawing, laser separation, water jet cutting, sandblasting or a combination of these methods. Sawing has the advantage, in particular, that different saw blades can be used, as necessary, for the different regions of the composite element (chip components, polymer matrix). Any desired forms of the chip devices can be produced by laser separation. Water jet cutting has the advantage, in particular, that precise separation of the composite element can be achieved even in the case of large thicknesses of the composite element. Sandblasting has the advantage, in particular, that materials having a high hardness can readily be separated.

In a further advantageous configuration, metallic contact areas are applied to the composite element, in such a way that the contact areas are arranged at least partly on the polymer matrix, and contact elements are applied to the contact areas applied on the polymer matrix. This has the advantage that the polymer matrix can be utilized for applying contact elements. The area of the individual chip components can thus be kept small. The number of chip components per wafer can thus be large. This produces a particularly cost-effective embodiment of the chip components. Furthermore, for the wiring a large area is available both on the chip components and on the polymer matrix.

In a further advantageous configuration, applying metallic contact areas to the composite element is effected by means of jet printing, screen printing or offset printing. The process of applying metallic contact areas can thus be effected in a very cost-effective manner.

In a further advantageous configuration, applying metallic contact areas to the composite element is effected by means of stencil printing. The process of applying metallic contact areas can thus be effected very efficiently and with high resolution and precision.

In a further advantageous configuration, at least surface-sensitive regions of the chip components are housed by means of a microencapsulation. This has the advantage that chip components such as MEMS devices can be protected well with regard to their mechanical, electrical and/or acoustic properties.

In accordance with a third aspect, the invention is distinguished by a chip device, which is produced by means of the method in accordance with the first aspect of the invention.

In a further advantageous configuration, the chip component comprises a MEMS chip. A MEMS chip constitutes a mechanically sensitive device for which the mechanical loading as a result of thermal expansion can be kept small by means of a suitably formed polymer matrix.

Furthermore, an apparatus for producing chip devices of the type described is specified. The apparatus is designed for providing at least one wafer having a plurality of chip components. The wafer or wafers are separated into the individual chip components and/or into groups of chip components. The individual chip components and/or or the groups of chip components are applied to a carrier element, in such a way that interspaces having a predetermined width are formed between the individual chip components and/or the groups of chip components. A polymer is introduced into the interspaces in order to form a composite element composed of the chip components and a polymer matrix. The composite element is separated in such a way that the chip devices composed of in each case one of the chip components and at least one section of the polymer matrix are formed.

BRIEF DESCRIPTION OF THE DRAWINGS

Exemplary embodiments of the invention are explained below with reference to the figures. The figures have been drawn up schematically and not as true to scale.

FIG. 1 shows a schematic view of wafers and of a carrier element with a composite element; and FIG. 2 shows a detailed view of the composite element and a chip device.

Elements having the same construction or function are provided with the same reference symbols throughout the figures.

The following list of reference symbols may be used in conjunction with the drawings:
10 First wafer
12 Second wafer
14 Chip component
16 Cutting line
18 Carrier element
20 Group of chip components
22 Interspaces
24 Polymer matrix
26 Composite element
28 Section of the polymer matrix
30 Contact areas
32 Contact element
34 Chip device

DETAILED DESCRIPTION OF ILLUSTRATIVE EMBODIMENTS

FIG. 1 shows a first wafer 10 and a second wafer 12. The first wafer 10 and the second wafer 12 each a have a multiplicity of chip components 14. The chip components 14 are preferably separated from one another by cutting lines 16.

The chip components 14 of the first wafer 10 can be, for example, MEMS devices (MEMS=microelectromechanical system). In further embodiments, the chip components 14 of the first wafer 10 can be formed as acoustic devices, for example, as BAW filters (BAW=bulk acoustic wave), or as surface acoustic wave filters (SAW filters). In alternative embodiments, the materials of the chip components 14 of the first wafer 10 are preferably embodied as monocrystalline piezoelectric material, in particular as quartz, lithium tantalate, lithium niobate or gallium orthophosphate. The chip components 14 of the second wafer 12, can be embodied, for example, as driving and/or evaluation chips. The chip components 14 can be embodied, in particular, as semiconductor components.

The method for producing chip devices 34 is explained in detail below.

Firstly, the first wafer 10 and the second wafer 12 are provided. In a further embodiment, if appropriate, only one wafer is provided. In further embodiments, it is also possible for more than two wafers to be provided.

The first wafer 10 is separated along the cutting lines 16 into the individual chip components 14 or into groups 20 of chip components 14.

Separating the wafers 10, 12 into the individual chip components 14 and/or into groups 20 of chip components 14 is preferably effected by means of sawing. Sawing constitutes a particularly simple and flexible method for separating the wafers 10, 12.

Alternatively or additionally, separating the wafers 10, 12 into the individual chip components 14 can also be effected by means of a DBG method (DBG =dicing before grinding). For this purpose, in a first step, the wafer 10, 12 is structured by means of a partial incision, for example, sawing on a first side of the wafer 10, 12. In this case, the depth of the sawing track or of the structural depression is less than the thickness of the wafer 10, 12. Preferably, the depth of the sawing track or of the structural depression is equal in magnitude to, or somewhat greater than, the desired thickness of the chip component 14. In a second step, material is removed areally from a second side of the wafer 10, 12. The second side faces away from the first side, in order to achieve a reduction of the thickness of the chip components 14. The chip components 14 on the sawed wafer 10, 12 has been reduced in terms of its thickness and are simultaneously separated from one another. Thus, a very small thickness of the chip components 14 can be realized, and it is possible to prevent material from breaking out at the edges of the chip components 14.

In a further embodiment, separating the wafers 10, 12 into the individual chip components 14 and/or into groups of chip components 14 can also be effected by means of a laser. It is thus possible to implement a particularly high accuracy in the course of separating into the individual chip components 14 and/or into the groups 20 of chip components 14. Furthermore, the use of the laser makes it possible to form arbitrarily shaped chip components 14 and/or groups 20 of chip components 14.

In a further preferred embodiment, separating the wafer 10, 12 into the individual chip components 14 and/or into groups of chip components 14 can also be effected by means of a stealth laser dicing method (stealth dicing). The stealth laser dicing method makes it possible to heat regions within the wafer 10, 12 to as much as 1500° C. in a targeted manner on account of the laser wavelength used and operation with a predetermined high frequency and high energy. The crystal structure thus changes in the regions, in particular with the formation of a linear desired breaking region. Since the crystal structure is altered only in a small region of the wafer 10, 12, the surfaces of the wafer 10, 12 are not altered. Despite the locally high temperatures, no cooling is necessary in this separating method. Furthermore, cutting waste can be avoided in this case, such that even workpieces which are susceptible to contamination can be processed very well. Furthermore, the stealth laser dicing method is a dry process requiring no cleaning, and is therefore particularly suitable for the processing of sensitive components such as MEMS chips, for example. Furthermore, high separating speeds, a small cutting trench and low running costs can be realized.

In a further step, the individual chip components 14 and/or the groups 20 of the chip components 14 are applied to a carrier element 18. The individual chip components 14 and/or the groups 20 of the chip components 14 are applied in such a way that interspaces 22 having a predetermined width are formed between the individual chip components 14 and/or the groups 20 of chip components 14. The interspaces 22 can extend both in the x direction and in the y direction.

Applying the individual chip components 14 and/or the groups 20 of chip components 14 to the carrier element 18 can be effected, in particular, in such a way that the carrier element 18 is a tape, such that the chip components 14 are arranged substantially in one line or in a plurality of lines. Applying the individual chip components 14 and/or the groups 20 of chip components 14 on a carrier element 18 embodied as a tape is preferably effected by means of die bonding or flip-chip bonding. The chip components 14 and/or the groups 20 of chip components 14 can thus be applied in a particularly cost-effective manner. Furthermore, the active sides of the chip components 14 can be protected against external influences particularly well. Subsequently, the carrier element 18 embodied as a tape is preferably expanded. What can thus be achieved is that interspaces 22 are produced between the individual chip components 14 and/or the groups 20 of chip components 14.

In a further embodiment, the carrier element 18 is, in particular, a carrier plate, as is shown in FIG. 1. The individual chip components 14 and/or the groups 20 of chip components 14 are applied, in particular, to the carrier element 18 embodied as a carrier plate in such a way that the chip components 14 form a rectangular matrix. This enables particularly simple further processing of the carrier element 18 with the chip components 14 in a further process steps.

After applying the individual chip components 14 and/or the groups 20 of chip components 14 to the carrier element 18, it is possible that the positions of the chip components 14 are not precisely defined as a result of tolerances during application and nonlinear effects. In a further step, therefore, after applying the individual chip components 14 and/or the groups 20 of chip components 14 to the carrier element 18, preferably a portion of the positions or all the positions of the individual chip components 14 on the carrier element 18 are determined. This can preferably be effected by means of an optical measurement of the positions of the chip components 14. The positions of the chip components 14 can then be stored in a file from which the positions of the chip components 14 can be retrieved again for the further process steps.

In a further step, a polymer is introduced into the interspaces 22 between the individual chip components 14 and/or the groups 20 of chip components 14. It is thus possible to form a polymer matrix 24 into which the chip components 14 and/or the groups 20 of chip components 14 are embedded. The chip components 14 and/or the groups 20 of chip components 14 together with the polymer matrix 24 form a composite element 26.

Preferably, the polymer is introduced into the interspaces 22 by means of laminating, liquid encapsulation, or jet printing, or by means of a combination of these methods. In the case of laminating, the polymer can be introduced into the interspaces 22 in a simple and rapid manner. In the case of liquid encapsulation, the polymer can be introduced into the interspaces 22 in a simple manner either by introduction of liquid polymer or by melting of a solid granulated polymer. In this case, the surface of the composite element 26 can be formed in a very homogeneous manner. In the case of jet printing, the polymer can be introduced into the inter-spaces 22 in a targeted manner, and the surface of the composite element 26 can be formed in a very homogeneous manner.

It is particularly preferred if a first polymer is introduced into the interspaces 22 in a first direction, and a second polymer is introduced into the interspaces 22 in a second direction, wherein the second direction is substantially perpendicular to the first direction. It is thus possible to counteract an anisotropic thermal expansion of the chip components 14 in different directions in a targeted manner.

It is particularly preferred if the first polymer is introduced in the first direction by jet printing, the first polymer is subjected to a prepolymerization and the second polymer is subsequently introduced into the interspaces 22 in the second direction by laminating or liquid encapsulation. This has the advantage that the first polymer can be introduced into the interspaces 22 in the first direction in a targeted manner by means of jet printing in a first step. In a second step, the second polymer can be introduced by means of laminating or liquid encapsulation at high speed. Furthermore, in the case of jet printing, it is also possible also to insert furthermore mechanical decoupling layers into the polymer matrix 24 in the x and/or y direction.

In a further step, metallic contact areas 30 are then applied to the composite element 26, wherein the contact areas 30 are arranged at least partly on the polymer matrix 24 (FIG. 2). The contact areas 30 are preferably applied by means of jet printing, screen printing, offset printing or stencil printing. Jet printing, screen printing and offset printing make it possible, in particular, that the metallic contact areas 30 can be applied in a very cost-effective manner. Stencil printing makes it possible, in particular to apply the metallic contact areas 30 with high resolution and high accuracy.

In a further step, contact elements 32 are applied to the contact areas 30 applied on the polymer matrix 24. The contact elements 32 can preferably be solder balls. The contact elements 32 can be applied to the metallic contact areas 30 applied on the polymer matrix 24 preferably mechanically or by means of stencil printing and reflow soldering.

In a further step, surface-sensitive regions of the chip components 14 are housed by means of a microencapsulation, as a result of which these can be protected with regard to their electrical and, if appropriate, acoustic properties. Preferably, a frame for the microhousing is applied to the polymer matrix 24, such that area of the chip components 14 can be saved.

In a further step, the composite element 26 is separated, in such a way that the chip devices 34 composed of in each case one of the chip components 14 and at least one section 28 of the polymer matrix 24 are formed. This can be seen in the lower part of FIG. 2, wherein in this embodiment, each chip device 34 is formed from one of the chip components 14 and two sections 28 of the polymer matrix 24.

Separating the composite element 26 into the chip device 34 can be effected, in particular, by sawing, laser separation, water jet cutting, sandblasting or a combination of these methods. Different methods or combinations thereof can thus be used for different requirements. Thus, sawing makes it possible that, as necessary, different saw blades can be used for the different regions of the composite element (chip components 14, polymer matrix 24). The form of the chip devices 34 can be chosen freely by means of laser separation. Water jet cutting makes it possible for even very thick composite elements 26 to be cleanly separated. By means of sandblasting, materials of great hardness can be separated well.

The production of chip devices 34 according to the invention has the advantage that the contact elements 32 can be applied to regions of the contact areas 30 which are arranged on the polymer matrix 24. The area requirement for the contact elements 32 on the area of the chip components 14 can thus be kept small. The area of the chip components 14 can thus be reduced.

The invention has been explained only on the basis of a few exemplary embodiments, but is not restricted thereto. In particular, method variants are possible which, in individual steps, can deviate from the steps illustrated.

What is claimed is:

1. A method for producing chip devices, the method comprising:
    providing a wafer having a plurality of chip components;
    separating the wafer into individual chip components and/or into groups of chip components;
    applying individual chip components and/or groups of chip components from the wafer to a carrier element, in such a way that interspaces having a predetermined width are formed between the individual chip components and/or the groups of chip components;
    introducing a first polymer into the interspaces along a first direction and substantially parallel to a major surface of the carrier element;
    introducing a second polymer different from the first polymer into the interspaces along a second direction that is substantially perpendicular to the first direction and substantially parallel to the major surface of the carrier element, wherein the introducing the first polymer and the introducing the second polymer form a composite element composed of the chip components and a polymer matrix; and
    separating the composite element, the separating the composite element forming chip devices each comprising at least one of the chip components and at least a portion of the polymer matrix;
    wherein the first polymer and the second polymer have physical properties that cause the first polymer and second polymer to, after the separating the composite element, at least partially counteract an anisotropic thermal expansion of the chip components in the first and second directions.

2. The method according to claim 1, wherein separating the wafer into the individual chip components and/or into groups of chip components comprises sawing or laser separating.

3. The method according to claim 2, wherein separating the wafer comprises laser separating performed by a stealth laser dicing method.

4. The method according to claim 1, wherein separating the wafer comprises:
    forming a partial incision on a first side of the wafer; and
    areally removing material on a second side of the wafer, the second side facing away from the first side.

5. The method according to claim 1, wherein the carrier element comprises a tape, and the individual chip components and/or groups of chip components are applied to the tape in such a way that the chip components are arranged substantially in one line or in a plurality of lines.

6. The method according to claim 1, wherein the carrier element comprises a carrier plate.

7. The method according to claim 1, wherein introducing the polymer into the interspaces comprises laminating, liquid encapsulation or by jet printing.

8. The method according to claim 1, wherein introducing the polymer into the interspaces comprises introducing a first polymer in a first direction and introducing a second polymer in a second direction, which is substantially perpendicular to the first direction.

9. The method according to claim 8, wherein the first polymer is introduced in the first direction using jet printing and the second polymer is introduced in the second direction using laminating or liquid encapsulation.

10. The method according to claim 1, wherein separating the composite element comprises sawing, laser separation, water jet cutting, sandblasting or a combination of these methods.

11. The method according to claim 1, further comprising:
applying metallic contact areas to the composite element, in such a way that the contact areas are arranged at least partly on the polymer matrix; and
applying contact elements to the contact areas applied on the polymer matrix.

12. The method according to claim 11, wherein applying metallic contact areas to the composite element comprises jet printing, screen printing, offset printing or stencil printing.

13. The method according to claim 1, wherein at least surface-sensitive regions of the chip components are housed by a microencapsulation.

14. The method according to claim 1, wherein providing a wafer comprises providing more than one wafer and wherein applying the individual chip components and/or groups of chip components comprises applying chip components or groups of chip components from the more than one wafer.

15. The method according to claim 14, wherein the individual chip components and/or groups of chip components are applied to the carrier element in such a way that the chip components are arranged in a rectangular matrix.

16. The method according to claim 14, wherein applying the individual chip components and/or the groups of chip components to the carrier element comprises die bonding or flip-chip bonding.

17. The method of Claim 14, wherein first ones of the chip components comprise microelectromechanical system (MEMS) devices, and wherein second ones of the chip components are semiconductor components.

18. The method according to claim 1, wherein applying the individual chip components and/or groups of chip components comprises applying individual chip components and/or groups of chip components from the same wafer.

19. A chip device, produced by the method according to claim 1.

20. The chip device of claim 19, wherein the chip device comprises a MEMS chip.

* * * * *